United States Patent [19]
Clark

[11] Patent Number: 6,069,530
[45] Date of Patent: May 30, 2000

[54] APPARATUS AND METHOD FOR LINEAR POWER AMPLIFICATION

[75] Inventor: Joseph Lynn Clark, Haltom City, Tex.

[73] Assignee: Motorola, Inc., Schaumburg, Ill.

[21] Appl. No.: 09/154,270

[22] Filed: Sep. 16, 1998

[51] Int. Cl.[7] ................................ H03F 1/26; H03G 3/20
[52] U.S. Cl. ........................................... 330/149; 330/136
[58] Field of Search .................................... 330/129, 136, 330/149, 279, 285

[56] References Cited

U.S. PATENT DOCUMENTS

| | | | |
|---|---|---|---|
| 5,138,274 | 8/1992 | Nakanishi et al. ...................... | 330/136 |
| 5,182,524 | 1/1993 | Hopkins .................................. | 330/149 |
| 5,963,090 | 10/1999 | Fukuchi .................................. | 330/149 |

OTHER PUBLICATIONS

Microwaves & RF, "LDMOS Transistor Powers PCS Base–Station Amplifier", Mar. 1998, vol. 37, No. 3, pp. 69–80.

*Primary Examiner*—Steven J. Mottola
*Attorney, Agent, or Firm*—Mario J. Donato, Jr.

[57] ABSTRACT

The method includes receiving a radio frequency (RF) input signal having an amplitude and a phase, adjusting the amplitude and the phase of the RF input signal to produce an adjusted RF input signal, amplifying the RF input signal to produce an RF output signal, and combining the adjusted RF input signal and the RF output signal to produce an error signal. Next, a power level of the error signal is detected, and based on the power level, automatically adjusting a gain and a phase of the RF output signal and automatically adjusting a bias of the amplifier.

16 Claims, 3 Drawing Sheets

6,069,530

APPARATUS AND METHOD FOR LINEAR POWER AMPLIFICATION

FIELD OF THE INVENTION

This invention relates generally to power amplifiers, and, more particularly, to an apparatus and a method for linear power amplification for an AB-biased amplifier wherein the bias is dynamically adjustable.

BACKGROUND OF THE INVENTION

It is often advantageous in electronic circuits to amplify a complex signal having multiple sinusoidal components (e.g., a multi-tone signal) without introducing distortion products into the amplified signal. The physical characteristics of contemporary amplifiers are such, however, that amplifiers do, in fact, inject distortion into the signal, especially when high power amplification is performed. In addition, linear power amplification is being required by today's complex communications systems for both multi-tone types of amplifiers and digital modulation schemes such as CDMA. Linearity is usually achieved at the expense of efficiency, especially at high power levels where it is a significant impact to system design and cost. The use of feed forward technology in linear power amplifiers is a way of achieving good linearity with improved efficiency, but adds to the cost and complexity of typical amplifiers. In addition to linearity requirements, many amplifier systems such as paralleled linear power amplifiers or other paralleled amplifier matrix systems require amplifier modules that have constant gain and phase for power combining efficiency.

In most amplifier designs, the majority of the distortion products are generated by the high power output or driver transistors. These stages cost the most money and dissipate the majority of the power of the amplifier and are consequently sized and biased to achieve the best efficiency possible. Many high power transistors operating with 8 dB or more backoff, which is required by multi-carrier and digital modulations, have IM performance that can vary with bias. The bias point for best IM performance will change with power, frequency, or temperature, and may vary from transistor to transistor. LDMOS type of transistors in particular have very sensitive IM versus bias curves, as discussed in *Microwaves & Rf,* March 1998, Vol. 37, No. 3, pages 69–80. Thus, a need exists for an apparatus and method for linear power amplification wherein the bias of the amplifier is dynamically adjustable.

SUMMARY OF THE INVENTION

According to an aspect of the present invention, the foregoing need is addressed by a method for linear amplification, the method comprising the steps of receiving a radio frequency (RF) input signal, amplifying the RF input signal to produce an RF output signal having a predetermined signal characteristic, and dynamically adjusting bias of the amplifier based upon the signal characteristic.

In accordance with another aspect of the present invention, a method for linear power amplification includes receiving a radio frequency (RF) input signal having a phase, adjusting the phase of the RF input signal to produce an adjusted RF input signal, amplifying the RF input signal to produce an RF output signal, and combining the adjusted RF input signal and the RF output signal to produce an error signal. Next, a power level of the error signal is detected, and based on the power level, automatically adjusting a gain and a phase of the RF output signal and automatically adjusting a bias of the amplifier.

Finally, in accordance with another aspect of the present invention, an apparatus for linear power amplification comprises an input device adapted to receive a radio frequency (RF) signal. An amplifier is coupled to the input device and adapted to produce an RF output signal having a predetermined signal characteristic. A detector is coupled to the amplifier, the detector being adapted to measure the signal characteristic and produce a signal characteristic measurement signal. A controller is coupled to the detector and adapted to dynamically adjust bias of the amplifier based upon the signal characteristic measurement signal.

Advantages of the present invention will become readily apparent to those skilled in the art from the following description of the preferred embodiment of the invention which has been shown and described by way of illustration. As will be realized, the invention is capable of other and different embodiments, and its details are capable of modifications in various obvious respects. Accordingly, the drawings and description are to be regarded as illustrative in nature, and not as restrictive.

DETAILED DESCRIPTION OF THE INVENTION

Figure 1:
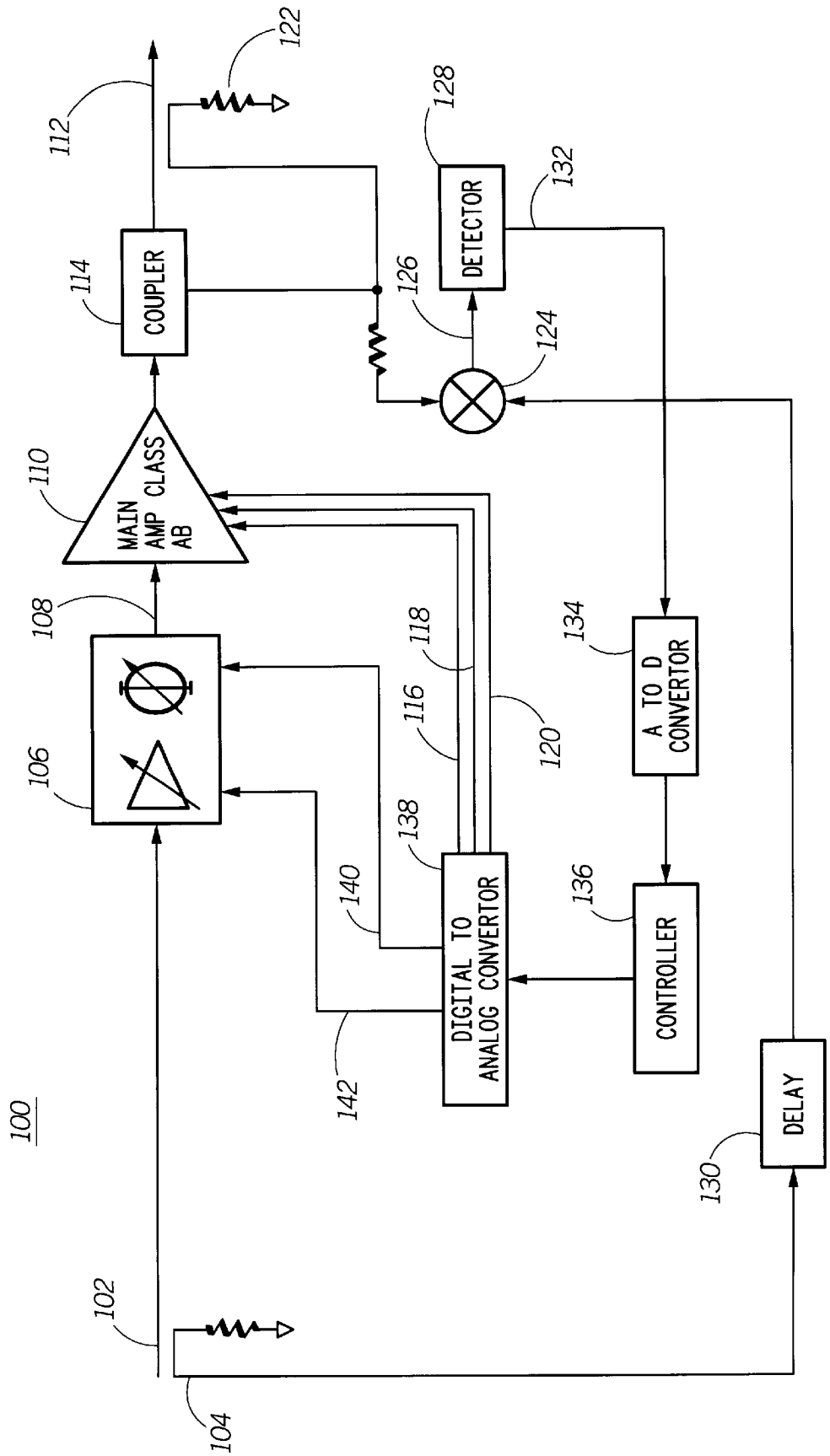
FIG. 1 is a block diagram of a linear power amplifier in accordance with the preferred embodiment of the present invention.

Turning now to the drawings, wherein like numerals designate like components, FIG. 1 illustrates a block diagram of a linear power amplifier in accordance with the preferred embodiment of the present invention. As shown in FIG. 1, operation of amplifier 100 in accordance with the preferred embodiment of the present invention occurs as follows: input signal 102 is input into phase and gain control block 106 for adjusting the phase and gain of the RF input signal 102. The adjusted RF input signal 108 is amplified by main amplifier 110 to produce an amplified RF output signal 112 responsive to the RF input signal 102. As previously mentioned, distortion and intermodulation components will be introduced by main amplifier 110. In the preferred embodiment, amplifier 110 is a class AB amplifier, having a gain control input 116, a phase control input 118, and a bias control input 120. RF output signal 112 is split by directional coupler 114, causing output signal 112 to be sampled at 122 and routed toward combiner 124.

To create an input signal to turn on each of the control lines 116, 118, and 120, the RF output 112 of amplifier 110 is sampled through low loss directional coupler 114 and combined with the sampled RF input signal 102. RF input signal 102 is delayed in time by delay circuit 130 to equal the path of the RF output signal 112 to the combiner 126, and added 180° in phase to each other so that the RF input signal 102 cancels the RF output signal 112 at the output of combiner 124. The sampled RF output signal 112 is also attenuated by the amount of gain of the amplifier path so that both the RF input signal 102 and the RF output signal 112 are of equal amplitude at combiner 124. Combiner 124 is configured to produce an error signal 126 having an amplitude.

A detector 128 configured to detect the error energy is coupled to combiner 124, and receives error signal 126. In the preferred embodiment, detector 128 is an RF power detector which determines a power level of the error signal 126. However, it will be appreciated by those skilled in the art that detector 128 may alternatively include a demodulator, a filter, a comparator, or any other device capable of determining out of band energy. The output 132 of detector 128, which in the preferred embodiment is a voltage, is then passed to an analog-to-digital converter 134, which is coupled to controller 136. In the preferred embodiment, controller 136 is a digital micro controller such as a Motorola 68 HC-11. The controller 136 is coupled to a digital-to-analog converter 138, which in turn is coupled to phase and gain control block 106 via phase and gain control block inputs 140 and 142, respectively. Digital-to analog converter 138 is further coupled to main amplifier 110 via gain control input 116, phase control input 118, and bias control input 120, allowing the controller 136 to adjust the gain, phase, and bias of the main amplifier 110. The gain and phase of the main amplifier 110 is adjusted so that the error signal 126 output of the combiner 124 is minimized. When good carrier cancellation is achieved, the only thing theoretically left at the output of the combiner 126 is the distortion products of the main amplifier 110. The detected signal is minimized when this condition occurs so that the gain and phase of the main amplifier 110 is being matched to a stable passive attenuator and delay line, giving it constant gain and phase.

Figure 2:
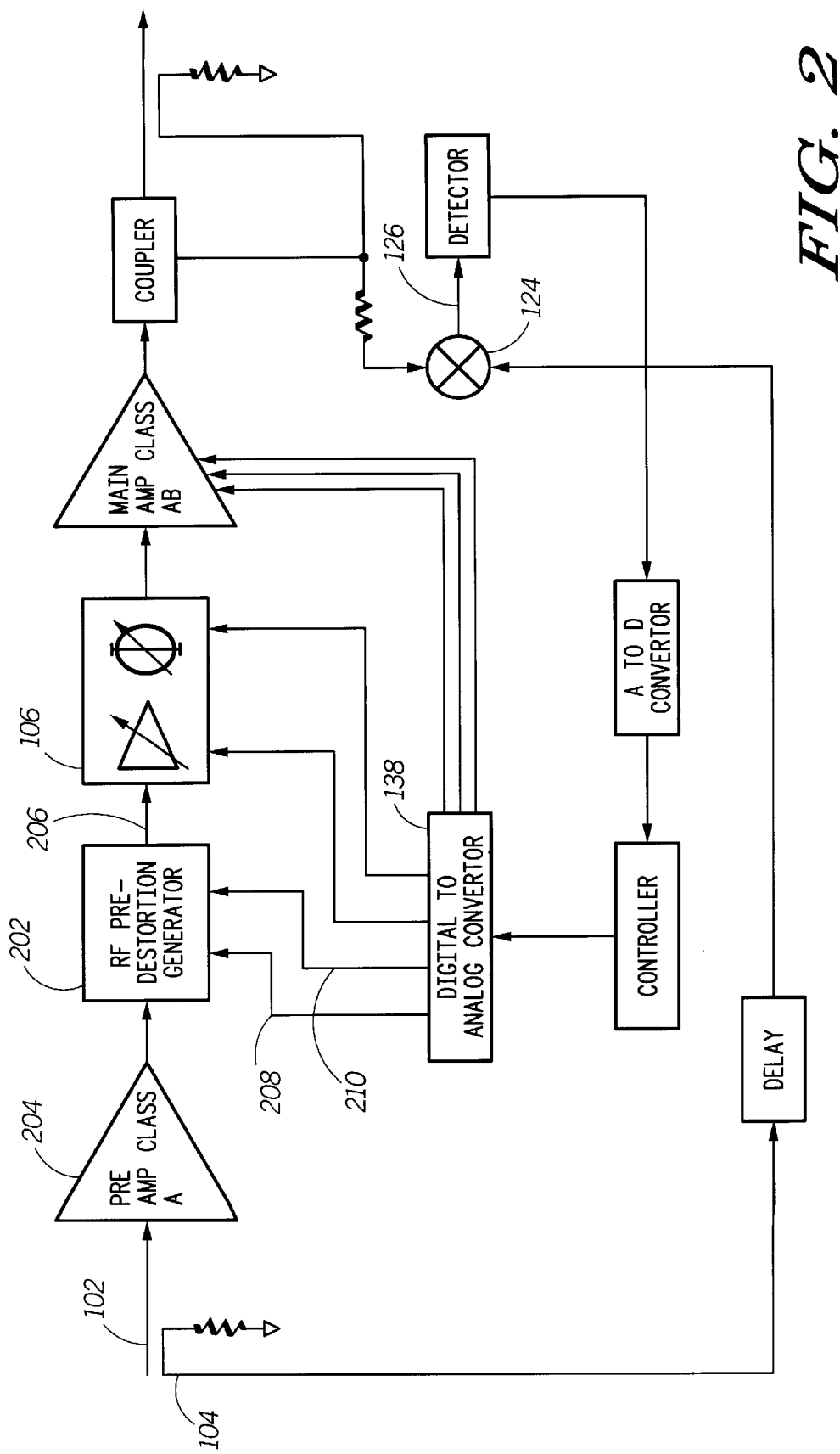
FIG. 2 is a block diagram of a linear power amplifier in accordance with an alternate embodiment of the present invention.

FIG. 2 illustrates a block diagram of a linear power amplifier in accordance with an alternate embodiment of the present invention, wherein an analog or RF predistorter 202 is added after the low level stages of the amplifier. In the preferred embodiment, the low level stages includes a class A preamplifier 204. The predistorter 202 generates and injects a distortion signal 206 that is 180° out of phase with the error signal 126 that is generated in the output stages. The distortion signal 206 and the error signal 126 are then combined in the output stages by combiner 124, and cancel each other. The amplitude and phase of the distortion signal 206 may also be controlled and tuned to minimize the distortion product of the combiner the same way the bias and carrier cancellation is tuned. For example, as shown in FIG. 2, DC control lines 208 and 210 are coupled between predistorter 202 and digital-to-analog converter 138 to control the gain and phase of the predistorted signal being injected into the main signal path. One benefit of predistortion IM improvement is that it is accomplished at the input or low level stages of the amplifier and does not cost the efficiency penalty of extra losses at the output network of a feed forward system. An additional benefit of the alternate embodiment of the present invention over a fixed tune predistortion system is that it is dynamically adjusting itself for the best IM cancellation for all operating conditions.

Figure 3:
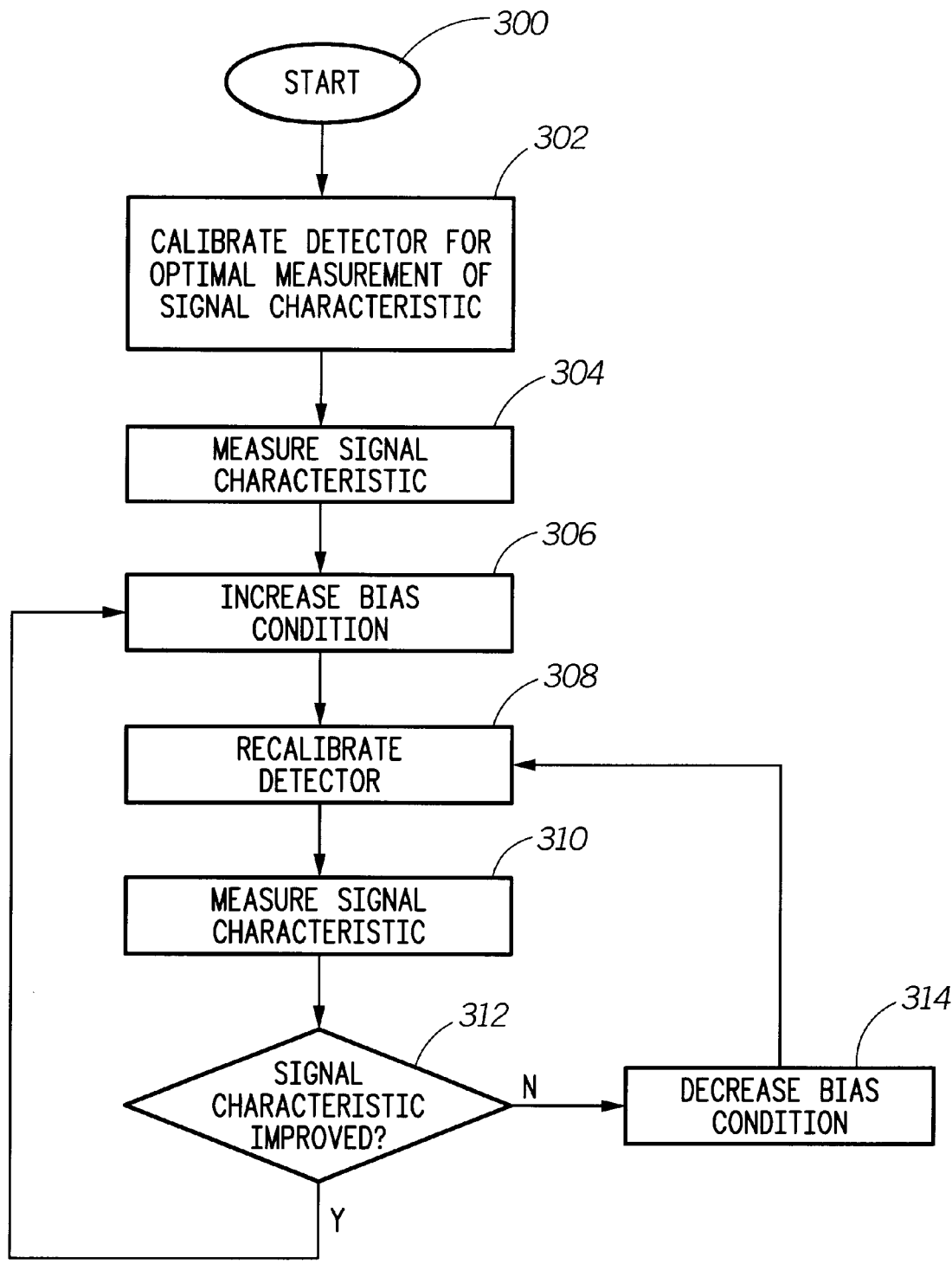
FIG. 3 is a flow chart illustrating those steps that the controller utilizes to optimize the linear power amplifier in accordance with the preferred embodiment of the present invention.

FIG. 3 is a flow chart illustrating those steps that the controller utilizes to optimize the linear power amplifier in accordance with the preferred embodiment of the present invention. The logic flow begins at step 300, and at step 302, the detector 128 is calibrated for optimal measurement of the signal characteristic by adjusting gain and phase block 106. As discussed above, amplified RF output signal 112 contains distortion and intermodulation components generated by main amplifier 110. Next, at step 304, a measurement of the signal characteristic is made. Continuing, at step 306, the bias condition is increased. It will be appreciated by those skilled in the art that the bias condition may be either increased or decreased at this point. At step 308, the detector is recalibrated, and at step 310, the signal characteristic is once again measured. Continuing, at step 312, a determination is made whether the signal characteristic has improved. If yes, then the flow proceeds back to step 306 and the bias condition is increased. If the signal characteristic has not improved, then the bias condition is decreased at step 314 and flow thereafter proceeds back to step 308, wherein the detector is recalibrated.

While the invention has been particularly shown and described with reference to a particular embodiment, it will be understood by those skilled in the art that various changes in form and details may be made therein without departing from the spirit and scope of the invention.

What is claimed is:

1. A method for linear power amplification, comprising the steps of:

receiving a radio frequency (RF) input signal;

using an amplifier, amplifying the RF input signal to produce an RF output signal having a predetermined signal characteristic;

dynamically adjusting bias of the amplifier based upon the signal characteristic, wherein the step of dynamically adjusting includes the steps of combining the RF input signal and the RF output signal to produce an error signal;

determining whether the error signal is within a predetermined range; and based on the error signal adjusting a gain and a phase of the RF output signal via a gain control input and a phase control input, respectively, coupled to the amplifier, and adjusting the bias of the amplifier via a bias control input coupled to the amplifier.

2. A method as recited in claim 1, wherein the step of combining includes adjusting a phase of one of the RF input signal and the RF output signal by 180 degrees.

3. A method as recited in claim 1, including the steps of generating a distortion signal having a phase that is out of phase with the error signal; and prior to amplifying the RF input signal, injecting the distortion signal into the RF input signal.

4. A method as recited in claim 3, wherein the step of dynamically adjusting is performed at an output stage and at a predistortion stage.

5. A method as recited in claim 3, wherein the step of generating comprises adjusting the phase of the distortion signal by 180 degrees.

6. A method for linear power amplification, comprising the steps of:

receiving a radio frequency (RF) input signal having an amplitude and a phase;

adjusting the amplitude and the phase of the RF input signal to produce an adjusted RF input signal;

using an amplifier, the amplifier having a gain control input, a phase control input and a bias control input, amplifying the RF input signal to produce an RF output signal;

combining the adjusted RF input signal and the RF output signal to produce an error signal;

detecting a power level of the error signal;

based on the power level, automatically adjusting a gain and a phase of the RF output signal via the gain control input and the phase control input, respectively; and based on the power level, automatically adjusting a bias of the amplifier via the bias control input.

7. The method according to claim 6, further comprising:

generating a distortion signal having a phase that is out of phase with the error signal; and prior to amplifying the RF input signal, injecting the distortion signal into the RF input signal.

8. A method as recited in claim 7 wherein the step of automatically adjusting is performed at an output stage and at a predistortion stage.

9. A method as recited in claim 7, wherein the step of generating comprises adjusting the phase of the distortion signal by 180 degrees.

10. A method as recited in claim 6, wherein the step of adjusting the phase of the RF input signal comprises adjusting the phase by 180 degrees.

11. An apparatus for linear power amplification, comprising:

an input device adapted to receive a radio frequency (RF) signal;

an amplifier coupled to the input device and adapted to produce an RF output signal having a predetermined signal characteristic;

a detector coupled to the amplifier, said detector adapted to measure the signal characteristic and produce a signal characteristic measurement signal;

a controller coupled to the detector and adapted to dynamically adjust bias of the amplifier based upon the signal characteristic measurement signal; and a combiner coupled to the detector and adapted to receive the RF input signal and the RF output signal, said combiner configured to produce an error signal;

wherein the amplifier includes a gain control input, a phase control input, and a bias control input, said controller adjusting a gain and a phase of the RF output signal via the gain control input and the phase control input, respectively, said controller adjusting the bias of the amplifier via the bias control input.

12. An apparatus as recited in claim 11, including a distortion signal generator coupled to the controller and adapted to produce an RF distortion signal having a gain and a phase that is out of phase with the error signal, the distortion signal being injected into the RF input signal.

13. An apparatus as recited in claim 12, wherein the distortion signal generator includes a gain control input and a phase control input, the gain and phase of the distortion signal being dynamically adjusted by the controller.

14. An apparatus for linear power amplification, comprising:

a first input adapted to receive a radio frequency (RF) input signal having an amplitude and a phase;

a phase adjuster adapted to adjust the phase of the RF input signal to produce an adjusted RF input signal;

an amplifier configured to produce an amplified RF output signal responsive to the RF input signal, the amplifier having a gain control input, a phase control input and a bias control input;

a combiner configured to produce an error signal having a phase, the combiner responsive to the adjusted RF input signal and the RF output signal;

an RF power detector responsive to the combiner, the RF power detector determining a power level of the error signal; and a controller responsive to the RF power detector, the controller configured to adjust, based on the power level, a gain and a phase of the RF output signal via the gain control input and the phase control input, respectively, and configured to adjust, based on the power level, a bias of the amplifier via the bias control input.

15. An apparatus as recited in claim 14, including a distortion signal generator coupled to the controller and adapted to produce an RF distortion signal having a gain and a phase that is out of phase with the error signal, the distortion signal being injected into the RF input signal.

16. An apparatus as recited in claim 15, wherein the distortion signal generator includes a gain control input and a phase control input, the gain and phase of the distortion signal being dynamically adjusted by the controller.

* * * * *